United States Patent
Saha et al.

(10) Patent No.: US 8,710,842 B2
(45) Date of Patent: Apr. 29, 2014

(54) APPARATUS AND METHOD TO REDUCE NOISE IN MAGNETIC RESONANCE IMAGING SYSTEMS

(75) Inventors: Saikat Saha, Florence, SC (US); Timothy John Havens, Florence, SC (US); Washington de Lima, Florence, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/042,188

(22) Filed: Mar. 7, 2011

(65) Prior Publication Data

US 2012/0229138 A1 Sep. 13, 2012

(51) Int. Cl.
G01V 3/00 (2006.01)
(52) U.S. Cl.
USPC ............................................................ 324/318
(58) Field of Classification Search
USPC ................................................ 324/300–322
See application file for complete search history.

(56) References Cited

U.S. PATENT DOCUMENTS

| | | | | |
|---|---|---|---|---|
| 5,278,502 A * | 1/1994 | Laskaris et al. | ............... | 324/318 |
| 5,519,372 A | 5/1996 | Palkovich et al. | | |
| 5,793,210 A * | 8/1998 | Pla et al. | ...................... | 324/318 |
| 6,437,568 B1 * | 8/2002 | Edelstein et al. | ............. | 324/318 |
| 6,567,685 B2 * | 5/2003 | Takamori et al. | ............. | 600/410 |
| 6,798,201 B2 * | 9/2004 | Kuth | ............................. | 324/317 |
| 6,812,705 B1 * | 11/2004 | Sellers | ......................... | 324/318 |
| 8,253,416 B2 * | 8/2012 | Ma et al. | ...................... | 324/318 |
| 8,410,777 B2 * | 4/2013 | Aubert | ......................... | 324/307 |
| 2004/0254419 A1 | 12/2004 | Wang et al. | | |
| 2005/0025797 A1 | 2/2005 | Wang et al. | | |
| 2005/0079132 A1 | 4/2005 | Wang et al. | | |
| 2005/0107870 A1 | 5/2005 | Wang et al. | | |
| 2007/0010702 A1 | 1/2007 | Wang et al. | | |

* cited by examiner

*Primary Examiner* — Dixomara Vargas
(74) *Attorney, Agent, or Firm* — The Small Patent Law Group; Dean D. Small

(57) ABSTRACT

An apparatus and method to reduce noise in magnetic resonance imaging (MRI) systems are provided. One MRI system includes a gantry having a bore therethrough and at least one radio frequency (RF) coil supported by the gantry for imaging an object within the bore. The MRI system also includes a vacuum space between the at least one RF coil and the bore.

27 Claims, 8 Drawing Sheets

APPARATUS AND METHOD TO REDUCE NOISE IN MAGNETIC RESONANCE IMAGING SYSTEMS

BACKGROUND OF THE INVENTION

The subject matter disclosed herein relates generally to magnetic resonance imaging (MRI) systems, and more particularly to systems and methods for reducing acoustic noise in these systems.

During operation of MRI systems, noise is generated by the vibration of gradient coils in a static main magnetic field when the coils are pulsed during imaging operation. Additionally, eddy currents are also generated by the gradient coils on any metallic surface, such as radio-frequency (RF) coils, the magnet warm bore, and other metallic components of the MRI system. The interaction of the eddy currents with the main magnetic field also produces vibrations, which results in acoustic noise.

The acoustic noise is often unpleasant (e.g., in the 110-120 dBA range) and transmitted to the patient's ears through the MRI system, such as through the RF coils. Accordingly, this acoustic noise can become quite loud, which can further adversely affect patients that are already apprehensive about the scan to be performed.

BRIEF DESCRIPTION OF THE INVENTION

In accordance with various embodiments, a magnetic resonance imaging (MRI) system is provided that includes a gantry having a bore therethrough and at least one radio frequency (RF) coil supported by the gantry for imaging an object within the bore. The MRI system also includes a vacuum space between the at least one RF coil and the bore.

In accordance with other embodiments, a magnetic resonance imaging (MRI) system gantry is provided that includes a gantry housing having a bore therethrough and at least one MRI coil supported by the gantry for imaging an object within the bore. The MRI system gantry also includes a cavity formed between the at least one MRI coil and the bore.

In accordance with yet other embodiments, a method for reducing acoustic noise in a magnetic resonance imaging (MRI) system is provided. The method includes forming an air space between a radio frequency (RF) coil or a gradient coil and a bore of a gantry of the MRI system. The method also includes creating and maintaining a low pressure environment within the air space.

DETAILED DESCRIPTION OF THE INVENTION

Figure 1:
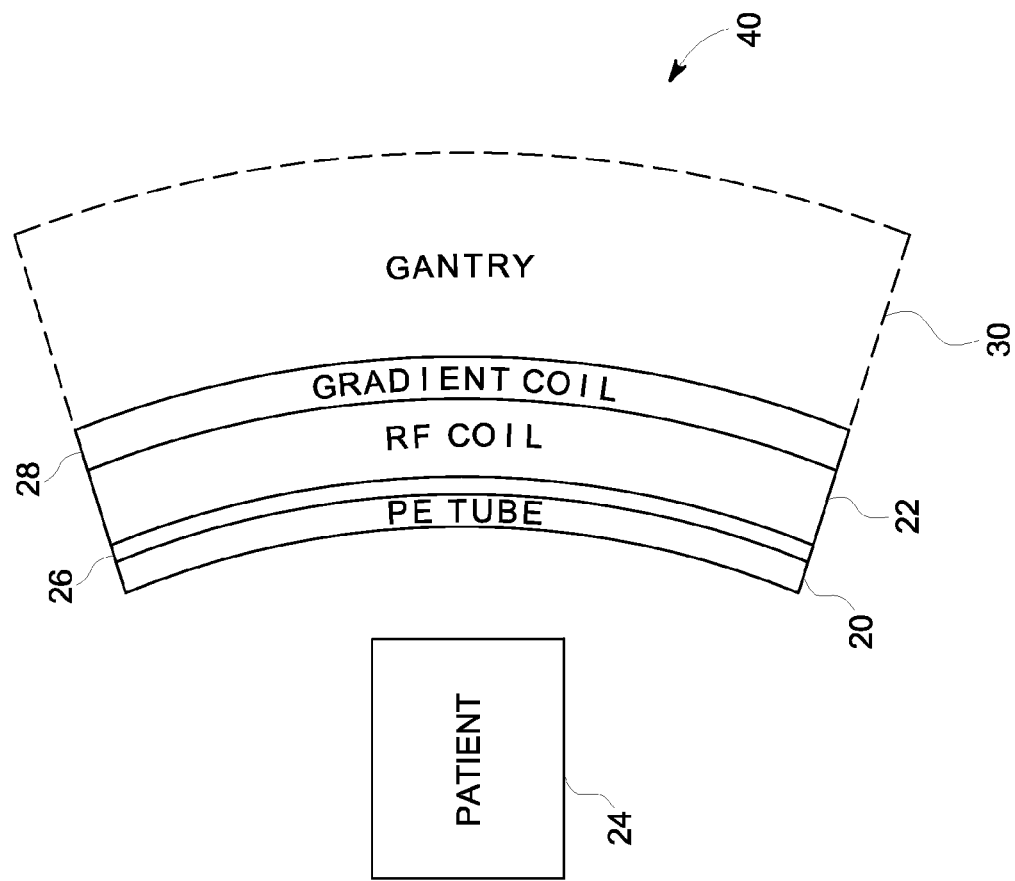
FIG. 1 is a simplified block diagram illustrating a patient enclosure (PE) tube configuration for a magnetic resonance imaging system (MRI) formed in accordance with one embodiment.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for reducing acoustic noise transmitted from a magnetic resonance imaging (MRI) system to a patient being imaged. In particular, as shown in FIG. 1, which is a simplified block diagram of one configuration, a vacuum, low pressure or air space is formed within the MRI system, which in this embodiment is formed using a patient enclosure (PE) tube 20 that is coupled or mounted inside a radio-frequency (RF) coil 22. The PE tube 20 in this embodiment is positioned radially inward from the RF coil 22. Accordingly, the PE tube 20 is the closest surface to a patient, thereby defining the innermost surface of a bore 42 of the MRI system, such as the MRI system 40 shown in FIG. 2 (a portion of which is shown in FIG. 1).

In various embodiments, a vacuum space 26 (or optionally an air space) is created or formed between the RF coil 22 (e.g., RF body coil) and the PE tube 20. As described in more detail herein, the vacuum space 26 is a space or cavity formed within the MRI system using any suitable method. For example, in one embodiment, a low or lower pressure space is formed, such that the pressure in that space is less than atmospheric pressure. Thus, different lower levels of pressure may be provided within the vacuum space 26, which are greater than an absolute vacuum pressure. In operation, this configuration reduces or prevents acoustic noise generated by the MRI system 40 from penetrating into the bore 42. For example, airborne noise generated by the MRI system 40, such as generated by gradient coils 28 that are also supported on a gantry 30 of the MRI system 40, are blocked, either partially or completely by the vacuum space 26 formed by the PE tube 20. Additionally, noise created by the eddy currents on the RF coil 22 from pulsing of the gradient coils 28 are also reduced or eliminated by the vacuum space 26 between the RF coil 22 and the PE tube 20.

In various embodiments the PE tube 20 is mechanically decoupled from the RF coil 22 and any other vibrating structure within the MRI system 40, such as the gradient coil 28. Thus, the PE tube 20 is coupled or mounted to a non-vibrating portion or component of the MRI system 40. For example, one embodiment of a mounting arrangement to reduce or limit vibration of the PE tube 20 includes mounting the PE tube 20 directly to the magnet body (as described in more detail herein). However, it should be appreciated that other mounting arrangements and mechanisms may be implemented to provide the lower or negligible level of vibration on the PE tube 20.

It should be noted that the presence of the PE tube 20 can also provide another level or layer of safety protection to the patient 24. For example, the PE tube 20 also may provide protection from burn hazards arising from electrical and/or thermal breakdown of capacitors, inductors, diodes, high power cables, among other components, of the MRI system that can generate high levels of heat.

Figure 2:
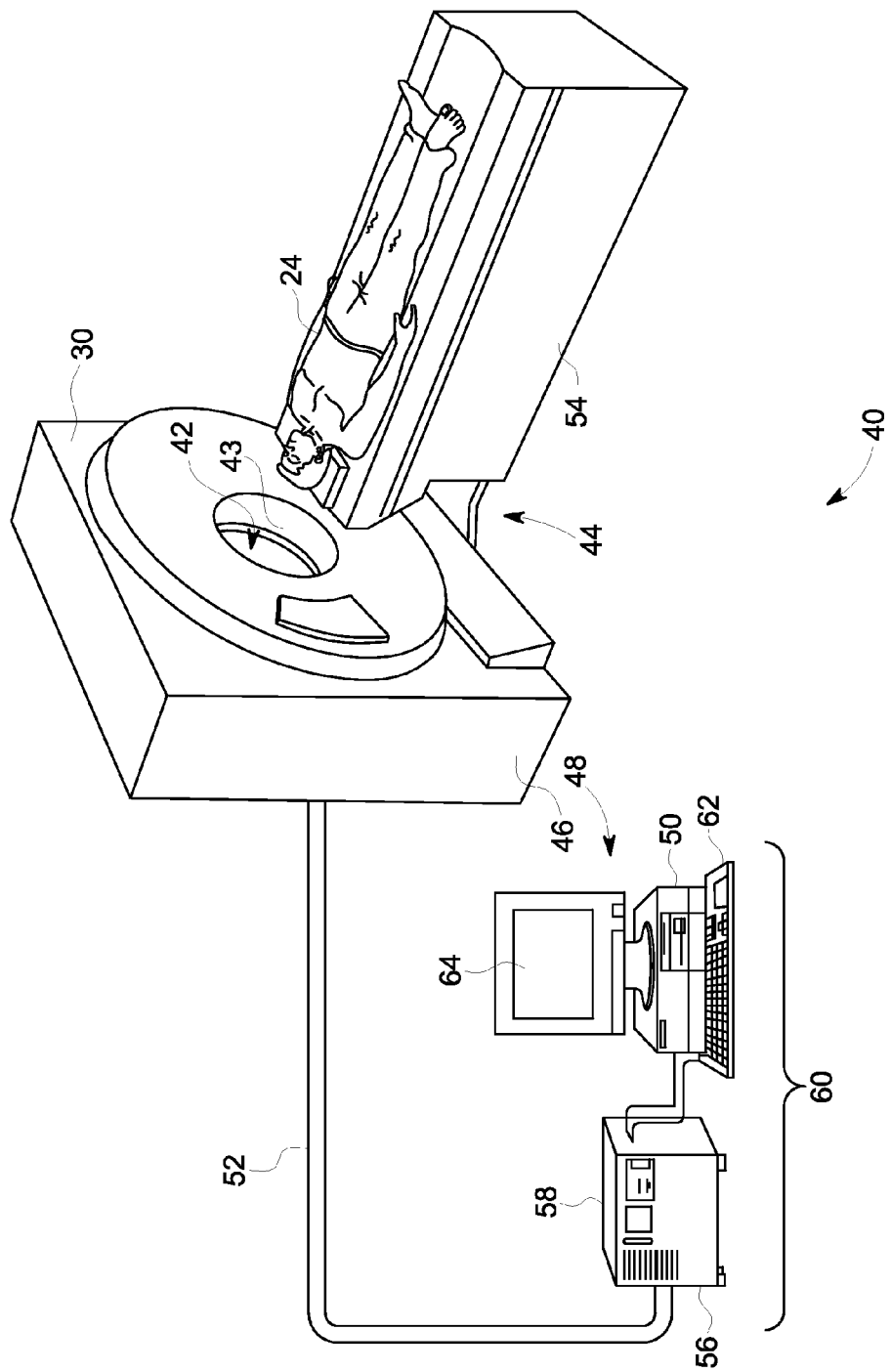
FIG. 2 is a pictorial view of an MRI system in which a PE tube formed in accordance with various embodiments may be implemented.

The PE tube 20 may define the innermost radial surface 43 of the bore 42 of the MRI system 40 shown in FIG. 2. It should be appreciated that although the MRI system 40 is illustrated as a single modality imaging system, the various embodiments may be implemented in or with multi-modality imaging systems, such as being combined with another system capable of generating images, particularly of a human. Moreover, the various embodiments are not limited to medical imaging systems for imaging human subjects, but may include veterinary or non-medical systems for imaging non-human objects, luggage, etc.

Referring to FIG. 2, the MRI system 40 includes an imaging portion 44 having an imaging unit 46 (e.g., imaging scanner) and a processing portion 48 that may include a processor 50 or other computing or controller device. In particular, the imaging unit 46 enables the MRI system 40 to scan an object or the patient 24 to acquire image data, which may be image data of all or a portion of the object or patient 24. The imaging unit 46 includes the gantry 30 having one or more imaging components (e.g., magnets or magnet windings, as well as coils within the gantry 30) that allow acquisition of the image data. In multi-modality imaging systems, in addition to the magnet(s) for magnetic resonance imaging, an x-ray source and detector for computed-tomography imaging, or gamma cameras for nuclear medicine imaging may be provided. The imaging components produce signals that represent image data that is communicated to the processing portion 48 via a communication link 52 that may be wired or wireless. During an imaging scan by the imaging unit 46, the gantry 30 and the imaging components mounted thereon or therein may remain stationary or rotate about or along a center of rotation defining an examination axis through the bore 42. The patient 24 may be positioned within the gantry 30 using, for example, a motorized table 54.

In operation, an output of one or more of the imaging components is transmitted to the processing portion 48, and vice versa, which may include transmitting signals to or from the processor 50 through a control interface 56. The processor 50 also may generate control signals for controlling the position of the motorized table 54 or imaging components based on user inputs or a predetermined scan. During a scan, image data, such as magnetic resonance image data from the imaging components may be communicated to the processor 50 through a data interface 58 via the control interface 56, for example, as acquired by one or more surface coils (e.g., a torso surface coil array).

The processor 50 and associated hardware and software used to acquire and process data may be collectively referred to as a workstation 60. The workstation 60 includes a keyboard 62 and/or other input devices such as a mouse, a pointer, and the like, and a display device 64. The display device 64 displays image data and may accept input from a user if a touchscreen is available.

Figure 3:
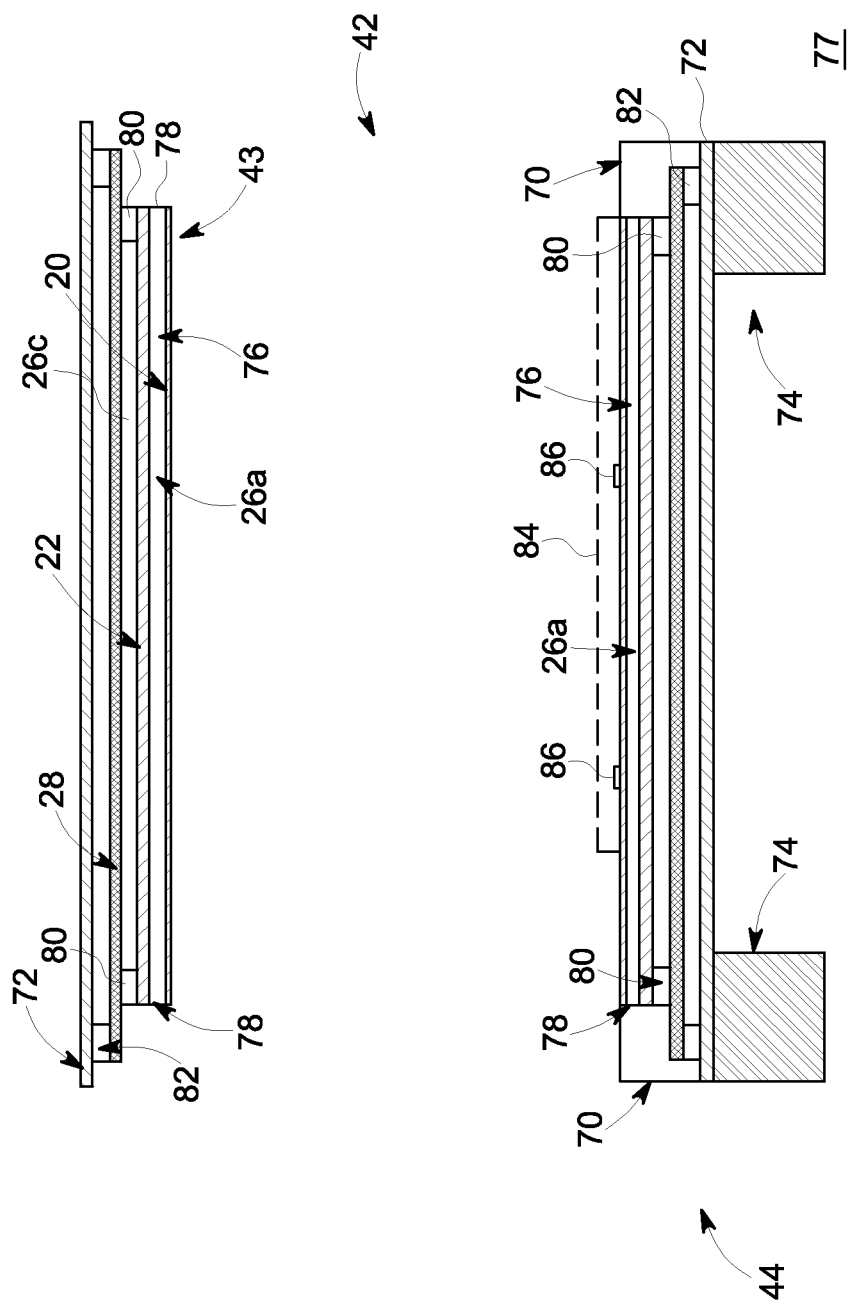
FIG. 3 is a simplified schematic diagram of a cross-section of an imaging portion or scanner of an MRI system formed in accordance with an embodiment.
Figure 4:
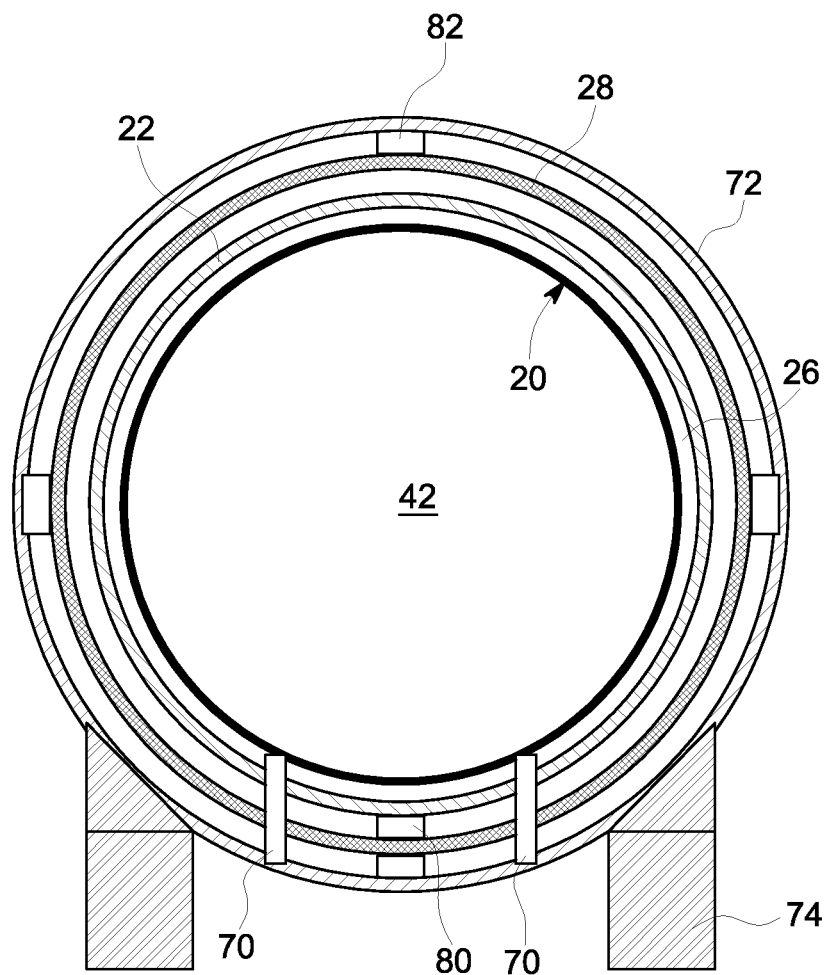
FIG. 4 is a simplified schematic diagram of a front view of the imaging portion of FIG. 3.

FIG. 3 is a simplified schematic diagram of a cross-section of an imaging portion or scanner of an imaging system, for example, the imaging portion 44 of the MRI system 40, formed in accordance with an embodiment. FIG. 4 is a simplified schematic diagram of a front view of the imaging portion 44. It should be noted that FIGS. 3 and 4 are not drawn to scale. As can be seen, the PE tube 20 is mounted within or radially inside the RF coil 22. A vacuum space 26 is formed between the RF coil 22 (e.g., RF body coil) and the PE tube 20. In this embodiment, the PE tube 20 is mechanically decoupled from the RF coil 22, as well as other vibrating components of the imaging portion 44, for example, the gradient coil 28. In one embodiment, a mounting component 70 (e.g., a mounting bracket, arm or other suitable support structure) is provided for mounting or otherwise coupling the PE tube 20 to a non-vibrating component of the imaging portion 44, which is illustrated as a portion of the system magnet 72 (e.g., superconducting magnet), which may be supported at a base by support elements 74 (e.g., magnet feet). It should be noted that only two mounting components 70 are shown in FIG. 3, one on each side of the PE tube 20. However, additional mounting components 70 may be provided as desired or needed. As another example, the PE tube 20 may be mounted directly to the system room floor 77.

In various embodiments, the PE tube 20 is coupled or mounted to any structure of the imaging portion 44 other than the RF coil 22. It should be noted that other mounting mechanisms may be provided to achieve a low or negligible level of vibration on the PE tube 20. Optionally, the mounting component 70 may include a suspension or vibration absorption element to further reduce any received vibrations or movements.

The PE tube 20 in various embodiments is a tube or cavity type structure that extends circumferentially within the RF coil 22. The PE tube may be formed from any suitable non-conductive material, such as a fiber reinforced plastic or glass. Optionally, the PE tube 20 may be formed from, coated or layered with a noise absorbing or insulating material. Thus, sound absorbing material may be provided at any of the locations where the vacuum space 26 is present. In other optional embodiments, a heat resistant material (or additional safety layer) may be provided on or over one or more surfaces of the PE tube 20.

In one embodiment, the PE tube 20 is an airtight or hermetically sealed structure forming an airtight cavity 76 with the RF coil 22, such that the vacuum space 26 may be formed therebetween. Thus, in various embodiments, the cavity 76 defines a space wherein air or other gases (if present) have been removed from therein. It should be noted that a partial or full vacuum space 26 may be formed. In one embodiment, one or more seals 78 are provided, which in this embodiment, are soft vacuum space seals, such as rubber seals, that seal one or more openings or ends of the cavity 76. The seals 78 may be secured to the PE tube 20 such that air within the cavity 76 is removed thereafter. In some embodiments, the PE tube 20 is not sealed, such that a vacuum space 26 is not provided. In these embodiments, the PE tube 20 forms an air cavity between the bore 42 and the RF coil 22.

Figure 5:
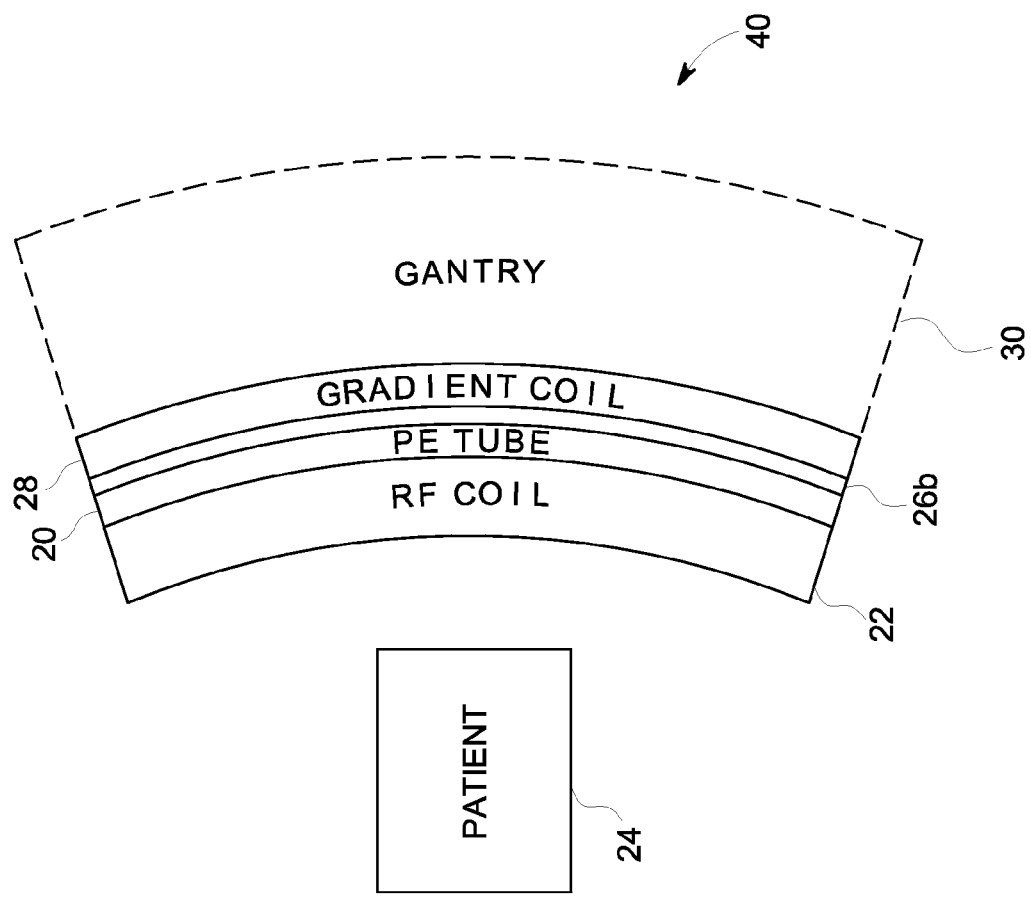
FIG. 5 a simplified block diagram illustrating a PE tube configuration for an MRI system formed in accordance with another embodiment.
Figure 6:
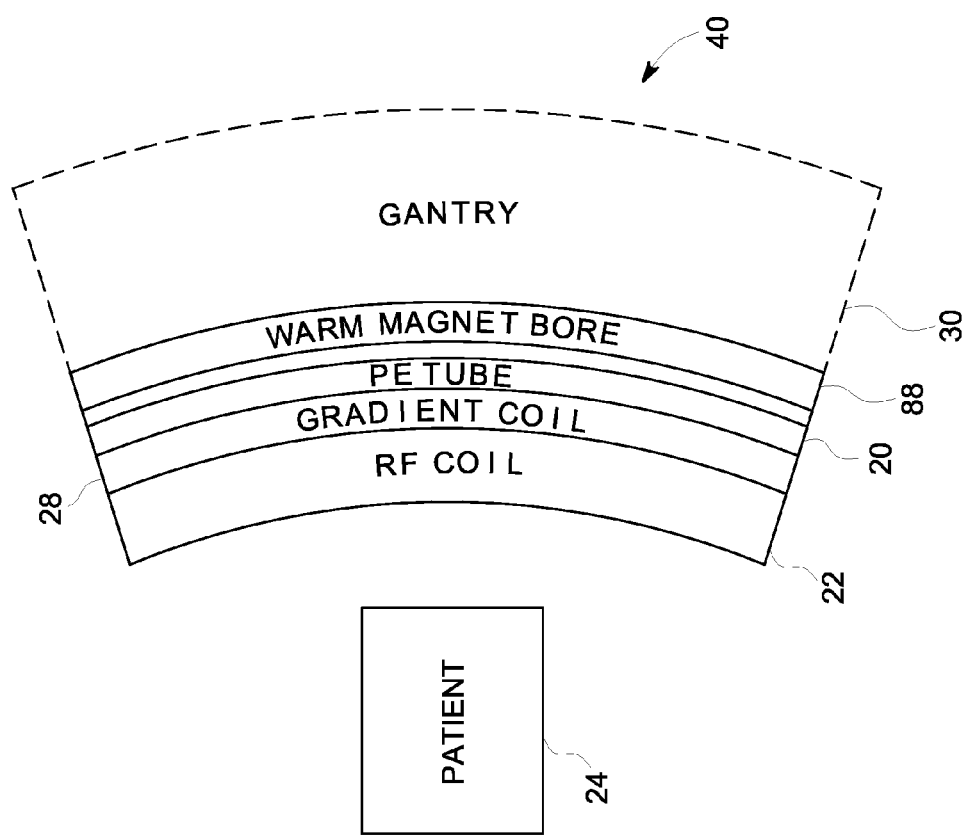
FIG. 6 a simplified block diagram illustrating a PE tube configuration for an MRI system formed in accordance with another embodiment.

It should be noted that although the vacuum space 26a or air space is described herein as formed between the PE tube 20 and the RF coil 22, the PE tube 20 may define or form different vacuum spaces 26 or air spaces. For example, the PE tube 20 may be positioned such that a vacuum space 26b or air space is formed between the gradient coil 28 and the PE tube 20 as shown in FIG. 5. As another example, the vacuum space 26 or air space may be formed between the inner diameter of the RF coil 22 and the outer diameter of the PE tube 20 instead of enclosing the entire PE tube 20. As still another example, a vacuum space 26c or air space may be formed between the gradient coil 28 and the RF coil 22 as shown in FIG. 3. In this embodiment, the vacuum space 26 or air space may be formed without the physical structure of the PE tube 20, such as by sealing the space between the gradient coil 28 and the RF coil 22, for example, using the seals 78. In still a further embodiment, the vacuum space 26 or air space may be formed between the magnet warm bore 88 and the PE tube 20 as shown in FIG. 6.

It also should be noted that the dimensions and configuration of the PE tube 20, for example, the length, shape and/or size of the PE tube 20 may be selected or optimized to increase or maximize the effect of the vacuum space 26 on the noise transmission (e.g., vibration noise) to or within the bore 42 and heard by the patient.

The various components within the imaging portion 44 are mounted or supported using suitable mechanisms. For example, the RF coil 22 may be coupled to the gradient coil 28 using suitable mounting structures 80 (e.g., support brackets). Additionally, the gradient coil 28 likewise may be mounted to the magnet 72 using suitable mounting structures 82.

Variations and modifications are contemplated. For example, a patient bridge or cradle 84, which forms part of the motorized table 54 (e.g., patient table, shown in FIG. 2) and extends within the bore 42 to position the patient 24 (shown in FIG. 2) therein, may be maintained in place with the PE tube 20. For example, stops or protrusions 86 may be used to maintain or align the cradle 84 within the bore 42.

Figure 7:
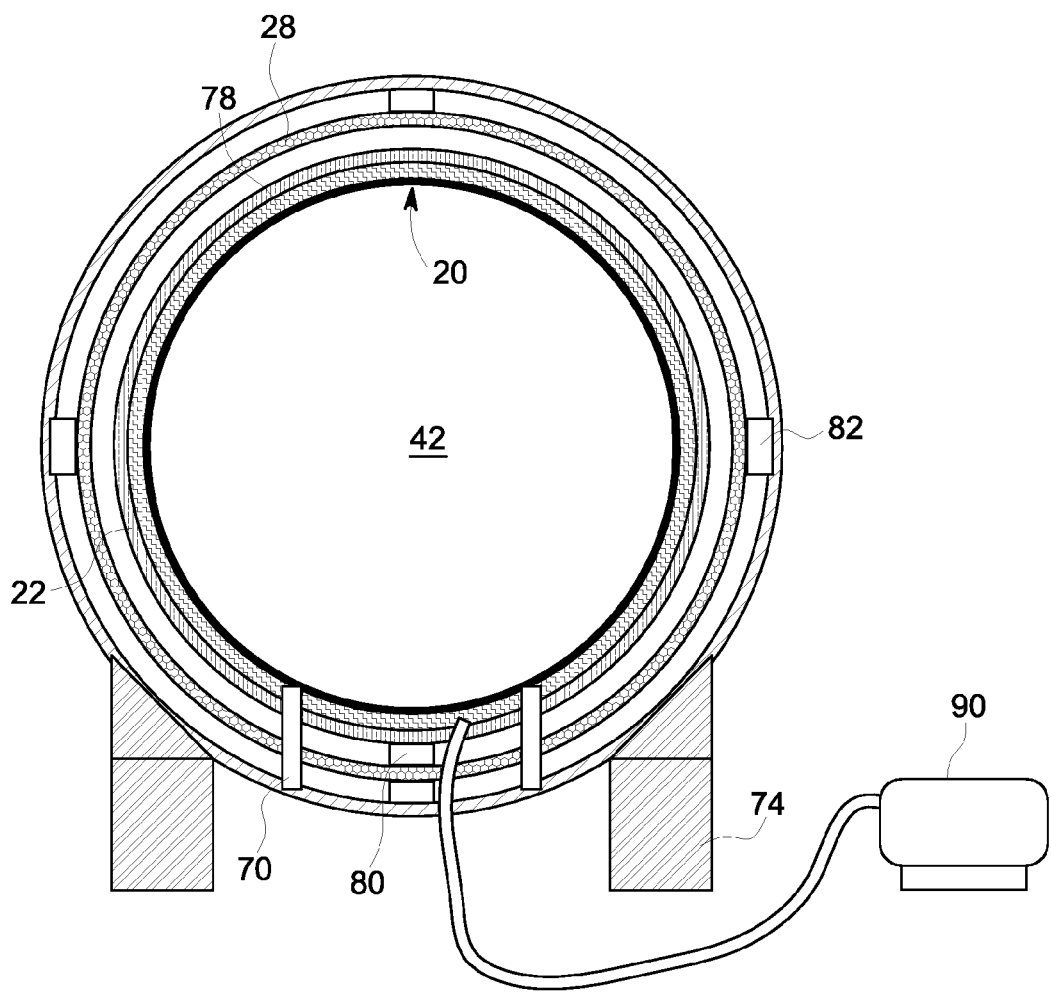
FIG. 7 is a simplified schematic diagram of a front view of an imaging portion formed in accordance with an embodiment illustrating a sealing arrangement.

Thus, as shown in FIG. 7, in operation, a vacuum pump 90 may be used to remove air and form the a low or lower pressure space within the vacuum space 26 (e.g., less than atmospheric pressure) defined by the PE tube 20 (and optionally other components) and the seal 78. As can be seen, the seal 78 in this embodiment extends circumferentially around ends of the vacuum space 26 between the PE tube 20 and the RF coil 22. However, as described herein, the vacuum or air space may be formed in different regions or areas.

The various embodiments may be implemented in connection with different types of MRI systems. For example, the various embodiments may be implemented with the MRI system 100 shown in FIG. 8. It should be appreciated that although the system 100 is illustrated as a single modality imaging system, the various embodiments may be implemented in or with multi-modality imaging systems. The system 100 is illustrated as an MRI imaging system and may be combined with different types of medical imaging systems or any other system capable of generating images, particularly of a human. Moreover, the various embodiments are not limited to medical imaging systems for imaging human subjects, but may include veterinary or non-medical systems for imaging non-human objects, luggage, etc.

Figure 8:
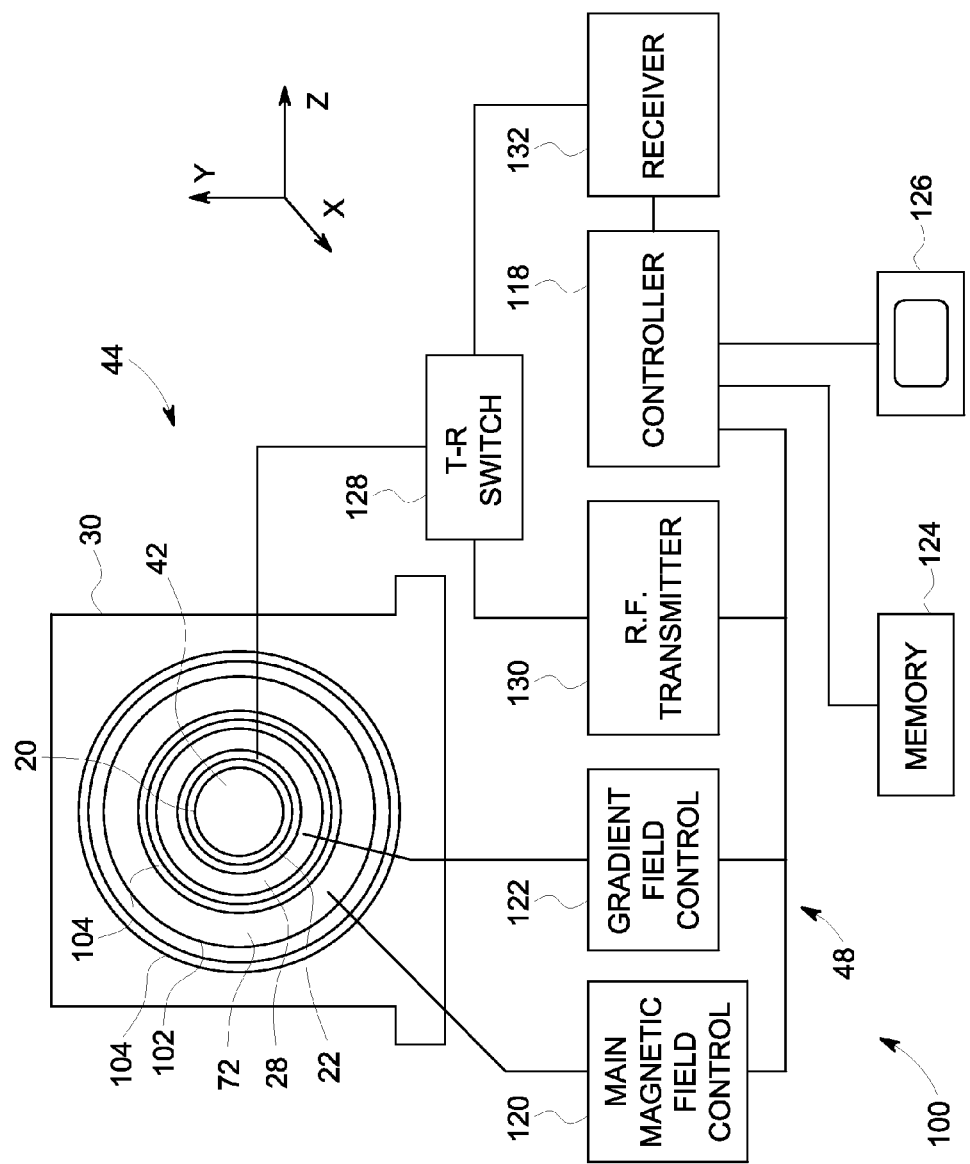
FIG. 8 is a block diagram of an MRI system in which a PE tube formed in accordance with various embodiments may be implemented.

Referring to FIG. 8, the MRI system 100 generally includes the imaging portion 44 and the processing portion 48 that may include a processor or other computing or controller device. The MRI system 100 includes within the gantry 30, a superconducting magnet, for example, the magnet 72 formed from coils, for example, coils supported on a former. A helium reservoir 102 (which may be a vessel and also referred to as a cryostat) surrounds the superconducting magnet 72 and is filled with liquid helium. The liquid helium may be used to cool the coils of the superconducting magnet 72, which includes providing the liquid helium to cooling tubes as described in more detail herein. Thermal insulation 104 is provided surrounding the outer surface of the helium reservoir 102 and the inner surface of the superconducting magnet 72. A plurality of magnetic gradient coils 28 are provided inside the superconducting magnet 72 and an RF transmit coil, for example, the RF coil 22 is provided within the plurality of magnetic gradient coils 28. Additionally, the PE tube 20 is provided within the RF coil 22 (or at other locations as described herein).

In some embodiments, the RF coil 22 may be replaced with a transmit and receive coil. The components within the gantry 30 generally form the imaging portion 44. It should be noted that although the superconducting magnet 72 is a cylindrical shape, other shapes of magnets can be used.

The processing portion 48 generally includes a controller 118, a main magnetic field control 120, a gradient field control 122, a memory 124, a display device 126, a transmit-receive (T-R) switch 128, an RF transmitter 130 and a receiver 132.

In operation, a body of an object, such as a patient or a phantom to be imaged, is placed in the bore 42 on a suitable support, for example, a patient table. The superconducting magnet 72 produces a uniform and static main magnetic field $B_o$ across the bore 42. The strength of the electromagnetic field in the bore 42 and correspondingly in the patient, is controlled by the controller 118 via the main magnetic field control 120, which also controls a supply of energizing current to the superconducting magnet 72.

The magnetic gradient coils 28, which include one or more gradient coil elements, are provided so that a magnetic gradient can be imposed on the magnetic field $B_o$ in the bore 42 within the superconducting magnet 72 in any one or more of three orthogonal directions x, y, and z. The magnetic gradient coils 28 are energized by the gradient field control 122 and are also controlled by the controller 118.

The RF coil 22, which may include a plurality of coils, is arranged to transmit magnetic pulses and/or optionally simultaneously detect MR signals from the patient if receive coil elements are also provided, such as a surface coil configured as an RF receive coil. The RF receive coil may be of any type or configuration, for example, a separate receive surface coil. The receive surface coil may be an array of RF coils provided within the RF coil 22.

The RF coil 22 and the receive surface coil are selectably interconnected to one of the RF transmitter 130 or receiver 132, respectively, by the T-R switch 128. The RF transmitter 130 and T-R switch 128 are controlled by the controller 118 such that RF field pulses or signals are generated by the RF transmitter 130 and selectively applied to the patient for excitation of magnetic resonance in the patient. While the RF excitation pulses are being applied to the patient, the T-R switch 128 is also actuated to disconnect the receive surface coil from the receiver 132.

Following application of the RF pulses, the T-R switch 128 is again actuated to disconnect the RF coil 22 from the RF transmitter 130 and to connect the receive surface coil to the receiver 132. The receive surface coil operates to detect or sense the MR signals resulting from the excited nuclei in the patient and communicates the MR signals to the receiver 132. These detected MR signals are in turn communicated to the controller 118. The controller 118 includes a processor (e.g., image reconstruction processor), for example, that controls the processing of the MR signals to produce signals representative of an image of the patient.

The processed signals representative of the image are also transmitted to the display device 126 to provide a visual display of the image. Specifically, the MR signals fill or form a k-space that is Fourier transformed to obtain a viewable image. The processed signals representative of the image are then transmitted to the display device 126.

Thus, various embodiments provide a low pressure (or vacuum) or air space that reduces acoustic noise transmitted to or within the bore of an MRI system. Accordingly, the acoustic noise experienced by a patient being scanned is lower.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A magnetic resonance imaging (MRI) system comprising:
    a gantry having a bore therethrough;
    at least one radio frequency (RF) coil supported by the gantry for imaging an object within the bore with a volume defined between the at least one RF coil and the bore;
    a patient enclosure (PE) tube including a cavity defining a vacuum space between the at least one RF coil and the bore that substantially encompasses an entirety of the volume defined between the at least one RF coil and the bore, the PE tube having ends disposed opposite each other along an axis of the bore; and
    mounting structures coupling the ends of the PE tube to a non-vibrating system magnet, wherein each of the ends of the PE tube has at least one mounting structure coupled thereto.

2. The MRI system of claim 1, wherein at least one mounting structure includes a vibration absorption element configured to reduce vibration of the PE tube.

3. The MRI system of claim 2, wherein the vacuum space is formed between the PE tube and at least one gradient coil within the gantry.

4. The MRI system of claim 2, wherein the vacuum space is formed between the PE tube and a magnet warm bore within the gantry.

5. The MRI system of claim 2, wherein the PE tube is mounted within and extends around the entire circumference of the bore to form the vacuum space therein.

6. The MRI system of claim 1, wherein the non-vibrating system magnet is a superconducting magnet extending axially past the ends of the PE tube.

7. The MRI system of claim 6, further comprising a gradient coil wherein the RF coil is mounted to the gradient coil with first brackets and wherein the gradient coil is mounted to the superconducting magnet via second brackets.

8. The MRI system of claim 1, wherein the non-vibrating system magnet is a superconducting magnet coupled to and supported by magnet feet configured to be coupled to a floor.

9. The MRI system of claim 1, wherein the PE tube is mounted directly to a body of the non-vibrating system magnet.

10. The MRI system of claim 1, wherein the PE tube is sealed to form an airtight cavity.

11. The MRI system of claim 1, wherein the vacuum space is formed between an inner diameter of the at least one RF coil and an outer diameter of the PE tube.

12. The MRI system of claim 1, wherein the object is a patient and further comprising a patient bridge mounted inside the PE tube.

13. The MRI system of claim 1, wherein the vacuum space is formed between the at least one RF coil and a gradient coil within the gantry.

14. The MRI system of claim 1, further comprising sound absorbing material in combination with the vacuum space.

15. The MRI system of claim 1, wherein the PE tube is mounted radially inside the at least one RF coil to define a closest surface to the object.

16. The MRI system of claim 1, further comprising a soft vacuum seal coupled to an opening of the vacuum space.

17. The MRI system of claim 16, wherein the soft vacuum seal comprises a radial seal extending circumferentially along one end of the vacuum space.

18. The MRI system of claim 1, further comprising a vacuum pump for forming at least a partial vacuum within the vacuum space.

19. The MRI system of claim 1, wherein the vacuum space is formed within the gantry by the PE tube, the PE tube including walls defining a hollow cavity therebetween that extends circumferentially within the gantry.

20. The MRI system of claim 1, wherein the volume is substantially free of any structures.

21. A magnetic resonance imaging (MRI) system gantry comprising:
    a gantry housing having a bore therethrough having an axial length and a circumference;
    at least one MRI coil supported by the gantry for imaging an object within the bore; and
    a patient enclosure (PE) tube including a hollow cavity defining a space between the at least one MRI coil and the bore, the space formed along substantially an entirety of an axial length of the PE tube between ends of the PE tube and substantially an entirety of the circumference between the at least one MRI coil and the bore; and mounting structures coupling the ends of the PE tube to a non-vibrating system magnet, wherein each of the ends of the PE tube has at least one mounting structure coupled thereto.

22. The MRI system gantry of claim 21, wherein the hollow cavity comprises a low pressure cavity.

23. The MRI system gantry of claim 21, wherein the hollow cavity comprises an air cavity.

24. The MRI system gantry of claim 21, wherein the non-vibrating system magnet is a superconducting magnet extending axially past the ends of the PE tube.

25. The MRI system gantry of claim 24, further comprising a gradient coil, wherein the RF coil is mounted to the gradient coil with first brackets, and wherein the gradient coil is mounted to the superconducting magnet via second brackets.

26. The MRI system gantry of claim 21, wherein the at least one MRI coil comprises one of a radio frequency (RF) coil or a gradient coil.

27. A method for reducing acoustic noise in a magnetic resonance imaging (MRI) system, the method comprising:

providing a patient enclosure (PE) tube forming an air space between a radio frequency (RF) coil and a bore of a gantry of the MRI system that extends between ends of the PE tube along substantially an entirety of an axial length of the PE tube and substantially an entirety of a circumference between the RF coil and the bore;

coupling the ends of the PE tube to a non-vibrating system magnet with mounting structures, wherein each of the ends of the PE tube has at least one mounting structure coupled thereto; and creating and maintaining a low pressure environment within the air space.

\* \* \* \* \*